United States Patent [19]
Battarel

[11] 3,996,575
[45] Dec. 7, 1976

[54] READING UNIT FOR A MAGNETIC DOMAIN PROPAGATION REGISTER ON A THIN LAYER

[75] Inventor: Claude Battarel, Magagnosc, France

[73] Assignee: Techniques et Systemes Informatiques, Paris, France

[22] Filed: June 9, 1975

[21] Appl. No.: 585,414

[30] Foreign Application Priority Data

June 25, 1974 France .................. 74.22089

[52] U.S. Cl. .................. 340/174 TF; 340/174 EB; 340/174 ZB
[51] Int. Cl.² ................................. G11C 11/14
[58] Field of Search ............... 340/174 TF, 174 EB, 340/174 ZB

[56] References Cited
UNITED STATES PATENTS 3,820,089  6/1974  Lana ........................ 340/174 EB

*Primary Examiner*—James W. Moffitt
*Attorney, Agent, or Firm*—Sughrue, Rothwell, Mion, Zinn & Macpeak

[57] ABSTRACT

Reading unit for a shift register according to the thin magnetic layer technology. For reading, the magnetoresistance effect is used. According to the invention, an electrical conductor, which overhangs the propagation channel is interrupted at the central point of the reading unit and a hard magnetic layer whose magnetization is directed perpendicularly to the easy axis of the propagation channel is deposited at that point. That layer tends to align the magnetization of the channel with its own magnetization and makes it possible, in co-operation with an energizing conductor, to obtain a difference in the resistance of the reading unit between the two states of a digital data item.

4 Claims, 3 Drawing Figures

READING UNIT FOR A MAGNETIC DOMAIN PROPAGATION REGISTER ON A THIN LAYER

BACKGROUND OF THE INVENTION

1. Field of the Invention

The invention concerns a reading unit for a magnetic domain propagation register on a soft magnetic layer. It applies to memories for digital computers according to the thin layer technique.

2. Description of the Prior Art

Since several years ago, it is known that the thin layer technique can be used for constituting shift registers (see, for example, U.S. Pat. No. 2,919,432). The digital data is propagated in the form of magnetization domains anti-parallel to a general magnetizing direction on a ferro-magnetic layer having uniaxial anisotropy.

At the output of a register, reading devices must transform the data contained in the magnetization into an electric signal. For that purpose, inductive or galvanometric phenomena such as magnetoresistance or, even, the plane Hall effect (see, for example, the article which appeared in IEEE Transactions on Magnetics Vol MAG 6 — No. September 1970, p. 451–463 and IEEE Transactions on Magnetics September 1971 p. 365–369).

The invention aims at proposing a reading unit which can be manufactured in the same way as actual shift registers, that is, by successive deposits of the magnetic, insulating and conductive layers which are adapted to selective reading of one unit among a number of existing units and which make it possible to distinguish easily between the two possible magnetization states. The unit according to the invention uses the magnetoresistance effect which, it is known, is insensitive to a change in the orientation of the magnetization through 180°. This difficulty has been overcome up till now for example by laying the output channel at 45° in relation to the easy axis of the magnetization in the thin layer of the register and by arranging the power points and the reading conductors on the outside of the channel. This arrangement requires a large space on the substrate of the register and therefore opposes the manufacturer's wish to increase the density of the data in the register.

SUMMARY OF THE INVENTION

To overcome that disadvantage, the invention proposes a reading unit for a magnetic domain propagation register on a soft magnetic layer, which is characterized in that this layer is covered, except at the central point of the unit, by a reading conductor in such a way that this conductor is interrupted at the said point and that a magnetically hard layer covers the soft layer at the said point, that hard layer having a permanent orientation which is substantially perpendicular to the easy axis of propagation.

The depositing of the hard layer being effected without any intermediate layer, there is an exchange coupling which tends to align the magnetization of the soft layer parallel to the magnetization of the hard layer, that latter having been orientated previously and permanently by a high transversal field. That coupling is dosed so that the magnetization of the soft layer turns by 90° in its thickness and that it remain about a quarter less than its thickness having the magnetization parallel to the magnetization of the soft layer outside the coupling zone. As will be seen further on, the magnetization in the soft layer at the place where the reading unit is installed during the applying of the propagation at the place where the reading unit is installed is mainly parallel to the easy axis when there is a domain there and perpendicular when there is no domain.

To set up the field for the propagation of the domains and to make the selecting of a reading unit among a great number of such units easier, to great advantage, an extra electric conductor which overhangs the said place parallel to the said permanent orientation of the hard layer, is provided, an insulating layer being formed between that conductor and the reading conductor.

In a preferred embodiment of the invention, the soft layer is composed of iron, cobalt, nickel and copper in such proportions that the average electronic concentration be about 27.7 electrons per atom (Ref. J. Smit Physica 21, 1955 p. 877) while keeping the magnetic parameters $HC = 3$ Oersted; $Hk = 30$ Oersted.

The invention will be described hereinbelow in greater detail with reference to an example of embodiment and to two figures.

DESCRIPTION OF THE PREFERRED EMBODIMENT

Figure 1:
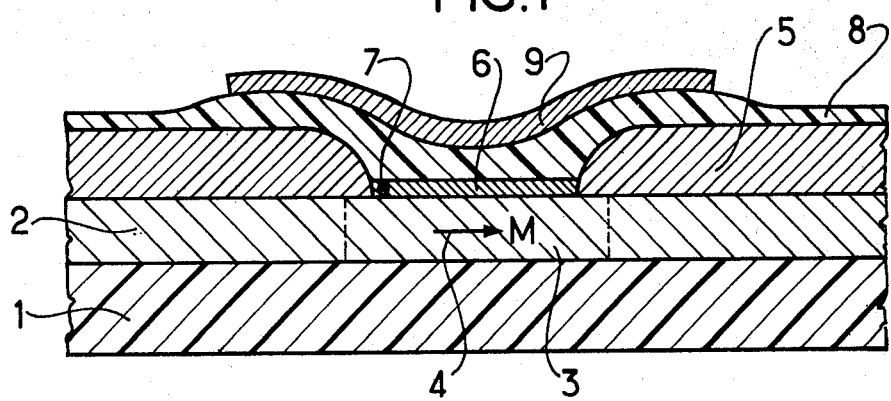
FIG. 1 shows diagrammatically a transversal and part cross-section of a shift register according to the invention comprising a reading unit.

A shift register using the thin layer technique is normally produced on an insulating substrate 1 made of glass, for example. A great number of propagation channels only one of which, 2, is seen in FIG. 1, are provided on that substrate. That channel can have the form of a linear tape whose axis is in the surface of FIG. 1. It is constituted by a thin magnetoresistant layer whose composition is approximately Ni/Co, 50/50. The thickness of that layer can be chosen as 100 Angstrom.

For the sake of simplicity in the description, the shift mechanism in the register has not been taken into account and it is assumed that a domain has reached the point 3 which constitutes the central point of the reading unit. As a function of the digital data, the magnetization M at that point is orientated either in the direction of the arrow 4 or in the opposite direction thereto.

The soft magnetic layer 2 is thickened over its whole surface, except at the point 3 where the reading unit is installed, by an electric conductor 5 which acts as a reading conductor. At the point 3, that conductor is interrupted and a current injected in the reading conductor is forced to pass through the magnetic layer 2 at the point where the reading unit is installed.

The surface of the soft layer, which is not covered by the conductor 5, is covered with a hard magnetic layer 6 of about 300 Angstrom. The magnetization of that layer is previously orientated by a transversal field whose amplitude is greater than the coercitive field $H'c$ of the hard layer, for example field of 1300 Oersted for an $H'c$ of 1000 Oersted. That magnetization is shown in FIG. 1 by an arrow 7, which penetrates into the surface of the figure.

Figure 2A:
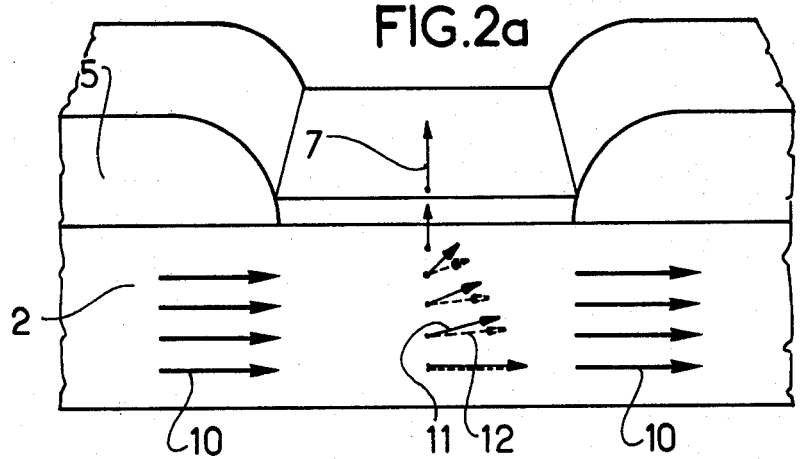
FIGS. 2a and 2b are diagrammatic views of the operation of such a unit.

Then comes an insulating layer 8, which covers the whole reading unit and contingently the whole shift register and on which is deposited another electric conductor 9, which overhangs preferably a great number of different reading units, perpendicularly to the direction of propagation. Reading is effected by the simultaneous injection of a pulse in at least one conductor such as 9 and at least one of the conductors such as 5. At the crossing point, the phenomenon which is shown in the two FIGS. 2a and 2b, in which the soft layer 2 and the metallic conductor 5 interrupted at the place where the reading unit is installed, are very diagrammatically shown. The effect of the hard layer 6 is shown by the arrow 7. That layer containing essentially cobalt, has a high coercitive field, of approximately 1000 Oersted and does not switch over under the effect of the propagation field, close to 15 Oersted.

Figure 2B:
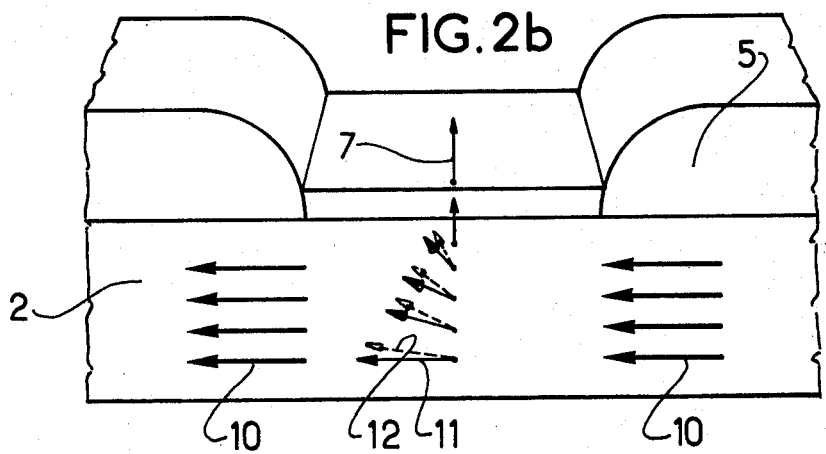

At the central point of the reading unit, the magnetization 11 shown in continuous lines show the situation through the thickness of the soft layer when there is no energizing current. It will be seen that the hard layer tends to align the magnetization of the soft layer parallel to its own orientation. The arrows 12 in discontinuous lines show the direction of the magnetization when there is a field applied by the passing of a current in the shift conductor 9. It is apparent that the magnetization in the soft layer at the point where the reading unit is installed is mainly parallel to the easy axis when there is a domain there (FIG. 2a) and perpendicular thereto when there is no domain there (FIG. 2b). By sending a current of 15 mA in the reading conductor 5, a difference of signals of 2 mV is obtained between the two cases. The best protection against spurious signals will be obtained for a detection of the signal during the applying of the field of propagation and of the energizing current by means of currents maintained in the conductors 5 and 9, at the moment when the domain, on propagating, enters the reading unit. Indeed, at that instant, there is no transition of current which could set up a spurious signal.

It should be mentioned that the field due to the current passing through the conductor 9 has a value of only 15 Oersted and is not sufficient to nucleate a domain and that when there is no current, no significant signal is obtained on the reading conductor 5.

The invention is not limited to the example of embodiment described hereinabove. For example, the composition of the layers can be modified, while ensuring that the electronic concentration of the soft layer remains close to 27.7 electrons/atom.

Also, the reading unit can be separated from the domain propagation channel or can be used for the detection of the direction of magnetization of a magnetic spot without destruction of the data (Non Destructive Read Only Memory).

I claim:

1. In a reading unit for a magnetic domain propagation register on a soft magnetic layer, the improvement wherein; said soft magnetic layer is covered, except at a central point of the unit, by a reading conductor such that said reading conductor is interrupted at said point, a magnetically hard layer covers the soft layer at said point, said hard layer has a permanent orientation which is substantially perpendicular to the easy axis of propagation.

2. The reading unit according to claim 1, wherein the soft layer is composed of iron, cobalt, nickel and copper in such proportions that the average electronic concentration is about 27.7 electrons per atom.

3. The reading unit according to claim 1, wherein an electric conductor overhangs said point parallel to the said permanent orientation of the hard layer, and an insulating layer is formed between that conductor and the reading conductor.

4. The reading unit according to claim 2, wherein the soft layer is composed of iron, cobalt, nickel and copper in such proportions that the average electronic concentration is about 27.7 electrons per atom.

* * * * *